United States Patent
Burnett et al.

(10) Patent No.: US 7,709,303 B2
(45) Date of Patent: May 4, 2010

(54) PROCESS FOR FORMING AN ELECTRONIC DEVICE INCLUDING A FIN-TYPE STRUCTURE

(75) Inventors: James D. Burnett, Austin, TX (US); Leo Mathew, Austin, TX (US); Byoung W. Min, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1009 days.

(21) Appl. No.: 11/328,668

(22) Filed: Jan. 10, 2006

(65) Prior Publication Data

US 2007/0161171 A1 Jul. 12, 2007

(51) Int. Cl.
*H01L 21/00* (2006.01)

(52) U.S. Cl. ............... 438/149; 257/347; 257/E29.137

(58) Field of Classification Search ............... 438/149, 438/151, 197, 199, 200, 283; 257/262, 270, 257/347, E29.137, E29.298
See application file for complete search history.

(56) References Cited

U.S. PATENT DOCUMENTS

| | | | |
|---|---|---|---|
| 4,701,423 A | 10/1987 | Szluk | |
| 5,384,473 A | 1/1995 | Yoshikawa et al. | |
| 6,166,413 A * | 12/2000 | Ono | 257/369 |
| 6,765,303 B1 | 7/2004 | Krivokapic et al. | |
| 6,815,277 B2 | 11/2004 | Fried et al. | |
| 6,867,460 B1 | 3/2005 | Anderson et al. | |
| 6,909,147 B2 | 6/2005 | Aller et al. | |
| 6,992,354 B2 | 1/2006 | Nowak et al. | |
| 7,112,455 B2 * | 9/2006 | Mathew et al. | 438/22 |
| 7,214,576 B1 * | 5/2007 | Kaneko et al. | 438/197 |
| 7,224,029 B2 | 5/2007 | Anderson et al. | |
| 7,382,020 B2 | 6/2008 | Liu et al. | |
| 7,575,975 B2 | 8/2009 | Thean et al. | |
| 2004/0113207 A1 | 6/2004 | Hsu et al. | |
| 2004/0222477 A1 | 11/2004 | Aller et al. | |
| 2005/0239242 A1 | 10/2005 | Zhu et al. | |
| 2006/0068531 A1 | 3/2006 | Breitwisch et al. | |
| 2006/0151834 A1 | 7/2006 | Anderson et al. | |
| 2007/0093010 A1 | 4/2007 | Mathew et al. | |

OTHER PUBLICATIONS

Actions on the Merits by the U.S.P.T.O. as of Apr. 2, 2008, 1 page.
Yang et al., "On the Integration of CMOS with Hybrid Crystal Orientations," 2004 IEEE Symposium on VLSI Technology Digest of Technical Papers, pp. 160-161.
Doris et al., "A Simplified Hybrid Orientation Technology (SHOT) for High Performance CMOS," 2004 IEEE Symposium on VLSI Technology Digest of Technical Papers, pp. 86-87.
Actions on the Merits by the U.S.P.T.O. as of Nov. 19, 2008, 1 page.
PCT/US06/61278 International Search Report, Aug. 18, 2008, 2 pages.
Actions on the Merits by the U.S.P.T.O. as of May 4, 2009, 1 page.

(Continued)

*Primary Examiner*—Brook Kebede

(57) ABSTRACT

A process for forming an electronic device can include forming a semiconductor fin of a first height for a fin-type structure and removing a portion of the semiconductor fin such that the semiconductor fin is shortened to a second height. In accordance with specific embodiment a second semiconductor fin can be formed, each of the first and the second semiconductor fins having a different height representing a channel width. In accordance with another specific embodiment a second and a third semiconductor fin can be formed, each of the first, the second and the third semiconductor fins having a different height representing a channel width.

20 Claims, 4 Drawing Sheets

OTHER PUBLICATIONS

U.S. Appl. No. 11/328,594, filed Jan. 10, 2006, Final Office Action mailed Jun. 24, 2009, 17 pages.

U.S. Appl. No. 11/328,779, filed Jan. 10, 2006, Notice of Allowance mailed Jul. 7, 2009, 6 pages.

* cited by examiner

US 7,709,303 B2

PROCESS FOR FORMING AN ELECTRONIC DEVICE INCLUDING A FIN-TYPE STRUCTURE

CROSS-REFERENCE TO RELATED APPLICATIONS

This application is related to U.S. patent application Ser. No. 11/328,594 entitled "Electronic Device Including a Fin-Type Transistor Structure and a Process for Forming the Electronic Device" by Orlowski et al. filed of even date herewith, and Ser. No. 11/328,779 entitled "An Integrated Circuit Using FinFETs and Having a Static Random Access Memory (SRAM)" by Burnett et al. filed of even date wherewith, both of which are assigned to the current assignee hereof and incorporated herein by reference in their entireties.

BACKGROUND

1. Field of the Disclosure

The present invention relates to a process for forming electronic devices, and more particularly, to electronic devices that include fin-type transistor structures.

2. Description of the Related Art

Fin-type field effect transistors ("FinFET"), formed on a common substrate typically have electrical channel widths that are in increments of substantially even, integer multiples of the height of the semiconductor fin(s) of the FinFET. Being limited to using FinFETs having channel widths limited in this manner can be problematic when optimizing designs to have operational characteristics to assure operation across a desired set of operating parameters. Therefore, it would be desirable to have FinFETs with a greater range of available channel widths.

SUMMARY

BRIEF DESCRIPTION OF THE DRAWINGS

The present disclosure may be better understood, and its numerous features and advantages made apparent to those skilled in the art by referencing the accompanying drawings.

The subject of the disclosure is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

In accordance with the present disclosure, a process for forming an electronic device can include forming a semiconductor fin of a first height for a fin-type transistor structure, and removing a portion of the semiconductor fin such that the semiconductor fin is shortened to a second height. In accordance with specific embodiments a second, or a second and a third semiconductor fin portions can be formed for respective fin-type transistor structures, each semiconductor fin having a different height to provide different channel widths. In specific embodiments, semiconductor fin portions may be doped with dopants of different conductivity-types, formed with channels having different crystal orientations, or any combination thereof. Specific embodiments of the present disclosure will be better understood with reference to FIGS. 1 through 9.

Other features and advantages of the invention will be apparent from the following detailed description, and from the claims.

Figure 1:
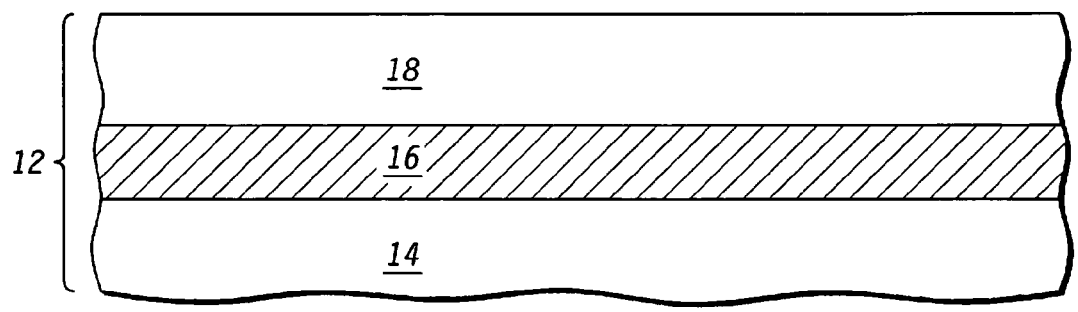
FIGS. 1 through 8 illustrate a specific embodiment of a process flow in accordance with the present disclosure.

FIG. 1 includes an illustration of a cross-sectional view of a portion of a substrate 12 at a location of workpiece 10 where fin-type transistors can subsequently be formed. In the illustrated embodiment, substrate 12 is a semiconductor-on-insulator ("SOI") substrate that includes layers 14, 16 and, 18. In the illustrated embodiment, layer 14 can be a support layer and provide mechanical support for the other layers of the substrate. Layer 14 can be a material with sufficient physical strength to support the other layers. For example, layer 14 can include an insulating material typically used in manufacturing semiconductor devices such as quartz, glass, plastic, or any combination thereof. In another embodiment, layer 14 can include a semiconductor material including a semiconductor element, such as silicon, germanium, carbon, or any combination thereof.

Layer 16 can be a buried insulating layer and provide electrical insulation between layer 14 and layer 18. Layer 16 can include an oxide, a nitride, and oxynitride, or any combination thereof. Layer 18 can be a semiconductor layer and can include a semiconductor element such as silicon, germanium, carbon, or the like and has a substantially uniform thickness in a range of approximately 50 to approximately 150 nm when measured in a direction substantially perpendicular to a major surface of workpiece 10. In one embodiment, layer 18 can include an n-type active semiconductor region, a p-type active semiconductor region or any combination thereof. It will be appreciated that that while substrate 12 is illustrated as an SOI substrate, other substrates could be utilized, such as a monocrystalline semiconductor wafer, or the like, that provide the ability to form semiconductor fins for FinFET transistors as described herein.

Figure 2:
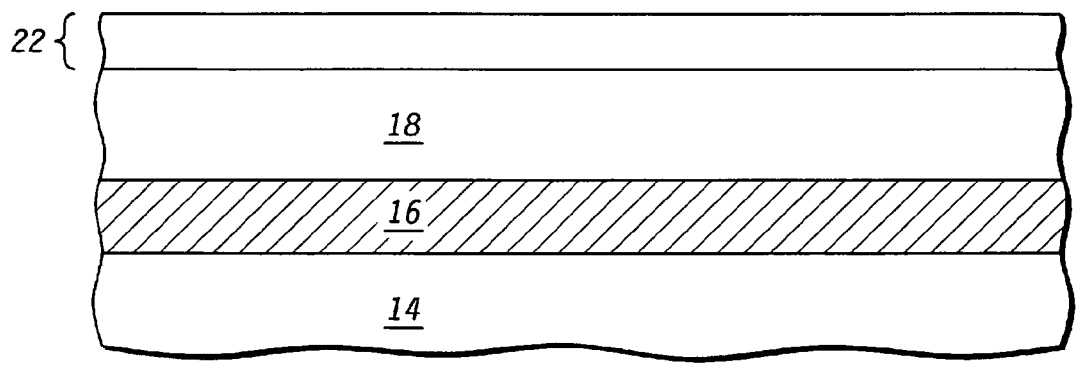

FIG. 2 includes an illustration of a cross-sectional view of workpiece 10 after formation of layer 22. In one embodiment, layer 22 can be used as a hard mask to protect portions of layer 18 from subsequent etches. The material of layer 22 is typically selected such that an etch process designed to remove exposed portions of layer 18 will remove exposed portions of layer 22 at a slower rate or not at all. Layer 22 can include an oxide, a nitride, an oxynitride, another material resistant to an etch process for removing layer 18, or any combination thereof. Layer 22 can have a thickness in a range of approximately 10 nm to approximately 100 nm and be grown or deposited by a conventional or proprietary process. In one embodiment, layer 22 can include a plurality of layers.

Figure 3:
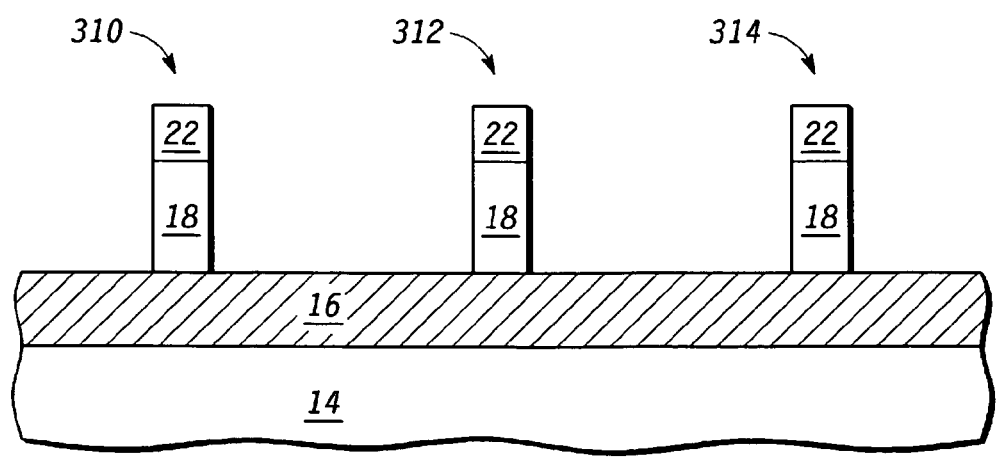

FIG. 3 includes an illustration of a cross-sectional view of workpiece 10 subsequent to removal of exposed portions of layer 18. A portion of layer 22 at locations 310, 312, and 314 overlies layer 18 and substantially protects layer 18 during a removal process. In the illustrated embodiment, a hard mask is formed from layer 22 by conventional or proprietary process, which can include a lithographic technique, an etch technique, or any combination thereof such that portions of layer 22 remain overlying layer 18 at locations 310, 312, and 314. An exposed portion of layer 18 is removed using an etch process to expose a portion of the underlying layer 16. A portion of layer 18 underlying remaining portions of layer 22 can form a semiconductor fin. The "height" of a semiconductor fin can have substantially the same value as the "thickness" of the previously formed layer 18. Note the term "height" is understood herein to refer to a distance measured in a direction substantially perpendicular to a major surface of substrate 12. In the illustrated embodiment, a semiconductor fin at location 312 can be associated with a FinFET that is a PMOS transistor, while semiconductor fins at locations 310 and 314 can be associated with that are NMOS transistors. In one embodiment, the remaining portion of layer 22 overlying a semiconductor fin can comprise a cap portion of subsequently formed fin-type transistor. In the illustrated embodiment, the remaining portion of layer 22 is removed.

Optionally, active semiconductor regions can be doped at this time. In one embodiment, the channel doping can be in a range of approximately 1E18 to approximately 6E18 atoms per cubic centimeter. In a specific embodiment, the channel doping can have a level of approximately 3 E18 atoms per cubic centimeter. In other embodiments the fin may be also undoped or lightly doped (1E15 to 1E17 atoms per cubic centimeter). In one embodiment, the semiconductor fin at location 312 can have a (110) crystal plane for the fin sidewall. In another embodiment, the semiconductor fin at locations 310 and 314 can have a (110) crystal plane for the fin sidewall.

Figure 4:
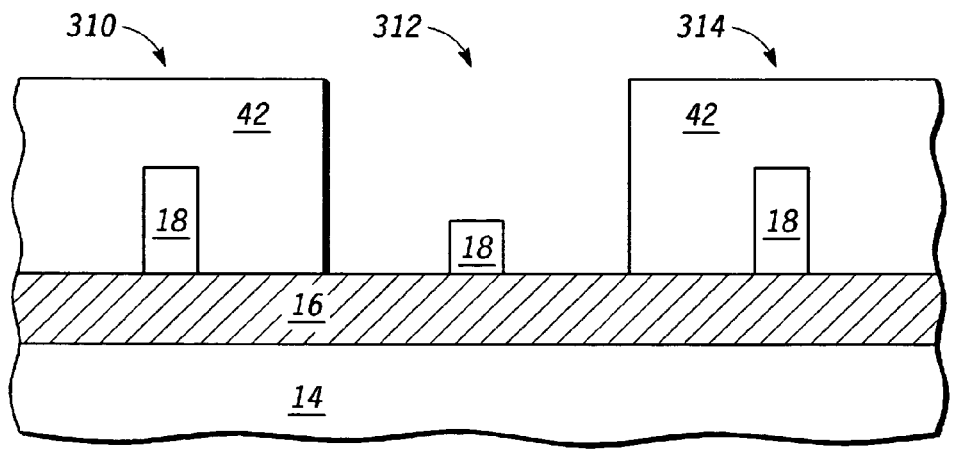

FIG. 4 illustrates a cross-sectional view of the workpiece 10 of FIG. 3 after a formation of patterned layer 42 and partial removal of the portion of semiconductor layer 18 at location 312. Pattered layer 42 can be formed over workpiece 10 to overlie locations 310 and 314 to protect them during processing at location 312. Patterned layer 42 can be lithographically formed from a radiation activated material resistant to a removal process for semiconductor layer 18. Exposed portions of semiconductor layer 18 can then be partially removed using conventional or proprietary process. In one embodiment, the removed portion of the semiconductor fin at location 312 can be as much as approximately 90% of the original height. In another embodiment, the remaining portion of semiconductor fin can have a second height in a range of approximately 10% to approximately 50% of the original height. In the illustrated embodiment, the remaining portion of semiconductor layer 18 at location 312 can substantially form the channel region for a p-channel FinFET transistor. In one embodiment, the channel region can be doped to levels as previously described. The remaining portion of patterned layer 42 can then be removed from workpiece 10.

Figure 5:
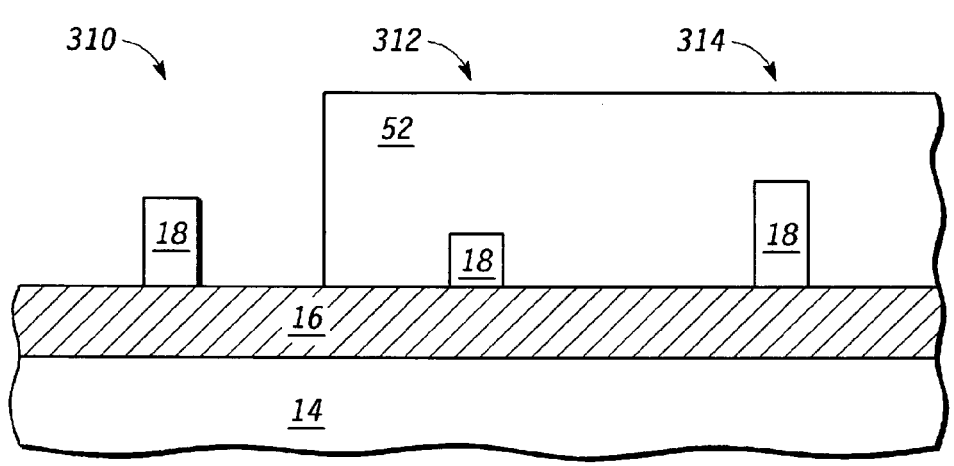

FIG. 5 illustrates a cross-sectional view of the workpiece 10 of FIG. 4 after a formation of patterned layer 52 and partial removal of the portion of semiconductor layer 18 at location 310. Pattered layer 52 can be formed over workpiece 10 to overlie locations 312 and 314 to protect them during processing at location 310. Exposed portions of semiconductor layer 18 can then be partially removed using conventional or proprietary process. For example, in one embodiment, the semiconductor fin at location 310 can be shortened by as much as approximately 75% of the original height. In another embodiment, the remaining portion of semiconductor fin can be in a range of approximately 25% to approximately 75% of the original height. In the illustrated embodiment, the remaining portion of semiconductor layer 18 at location 310 and location 314 can comprise the channel regions for n-channel FinFET transistors. In one embodiment, the channel region can be doped to levels as previously described. The remaining portion of patterned layer 42 can then be removed from workpiece 10.

In the illustrated embodiment, remaining portions of semiconductor layer 18 at locations 310, 312, and 314 can each form a semiconductor fin having a different height. As previously described, the portion at location 312 can have a smaller height than the portion at locations 310 and the portion at 310 can have a smaller height than the portion at 314. In one embodiment, the heights of the semiconductor fin portions at locations 310, 312, and 314 are in a ratio of approximately 0.5:0.2:1.0, respectively.

Figure 6:
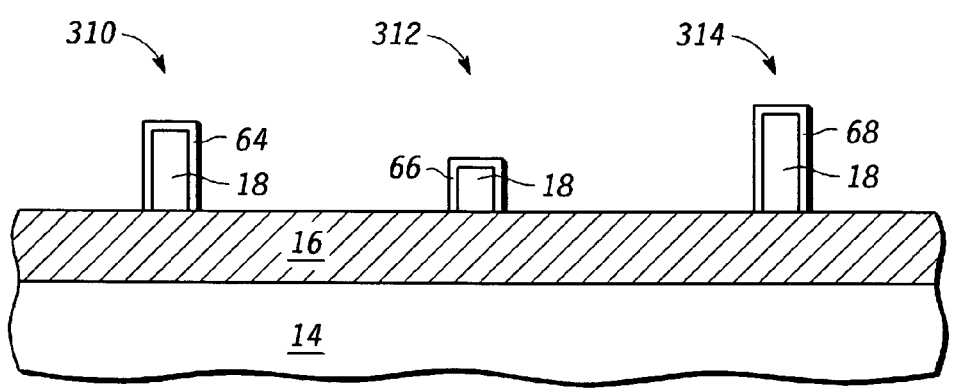

FIG. 6 illustrates a cross-sectional view of the workpiece of FIG. 5 after formation of layers 64, 66, and 68 at locations 310, 312, and 314, respectively. Layer 64 can serve as a gate dielectric. Layer 64 can include a film of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_d$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Layer 64 can have a thickness in a range of approximately 1 to approximately 25 nm. Dielectric layer 64 may be thermally grown using an oxidizing or nitridizing ambient, or deposited using a conventional or proprietary chemical vapor deposition ("CVD") technique, physical vapor deposition ("PVD") technique, or a combination thereof. As compared to dielectric layer 64, layers 66 and 68 can each have the same or different materials, be formed at the same or different time, have the same or a different thickness, or any combination thereof.

Figure 7:
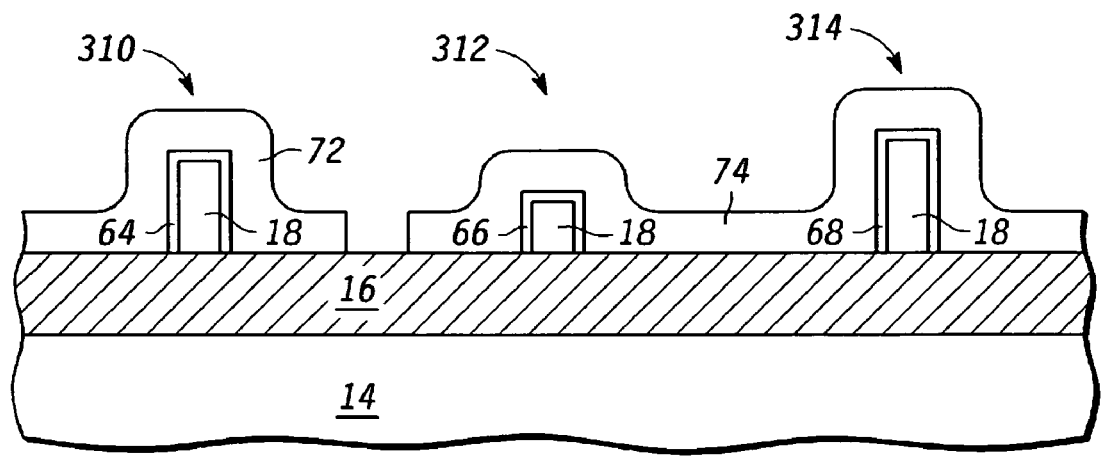

FIG. 7 includes an illustration of a cross-sectional view of the workpiece 10 of FIG. 6 after formation of conductive members 72 and 74. Conductive members 72 and 74 can serve as gate electrodes. A conductive layer suitable for forming gate electrodes can be grown or deposited over workpiece 10 to facilitate formation of conductive members 72 and 74. The conductive layer can include one or more semiconductor-containing materials, one or more metal-containing materials, or any combination thereof. In one embodiment, the conductive layer includes polysilicon or amorphous silicon deposited by a chemical vapor deposition process. In another embodiment, the conductive layer may include one or more other materials or may be deposited by another process such as a silicide. In one particular embodiment, the conductive layer is doped when deposited, and in another particular embodiment, is doped after it is deposited. In one embodiment, the thickness of the conductive layer is in a range of approximately 50 to approximately 500 nm, and in a finished device, remaining portions of the conductive layer have a dopant concentration of at least approximately 1E19 atoms/cm$^3$ when the conductive layer includes polysilicon or amorphous silicon.

The conductive layer used to facilitate formation of conductive members 72 and 74 can be patterned using a conventional or proprietary lithographic process (not illustrated) whereby exposed portions can be removed to form conductive members 72 and 74 overlying the semiconductor fins at locations 310, 312, and 314. Since the channel region can substantially extend to the height of the semiconductor fin of the fin-type structure, different sized semiconductor fins, like those of the illustrated embodiment at locations 310, 312, and 314, can form devices with different channel widths. In some embodiments, the channel width can be approximately twice the height of the semiconductor fin.

Figure 8:
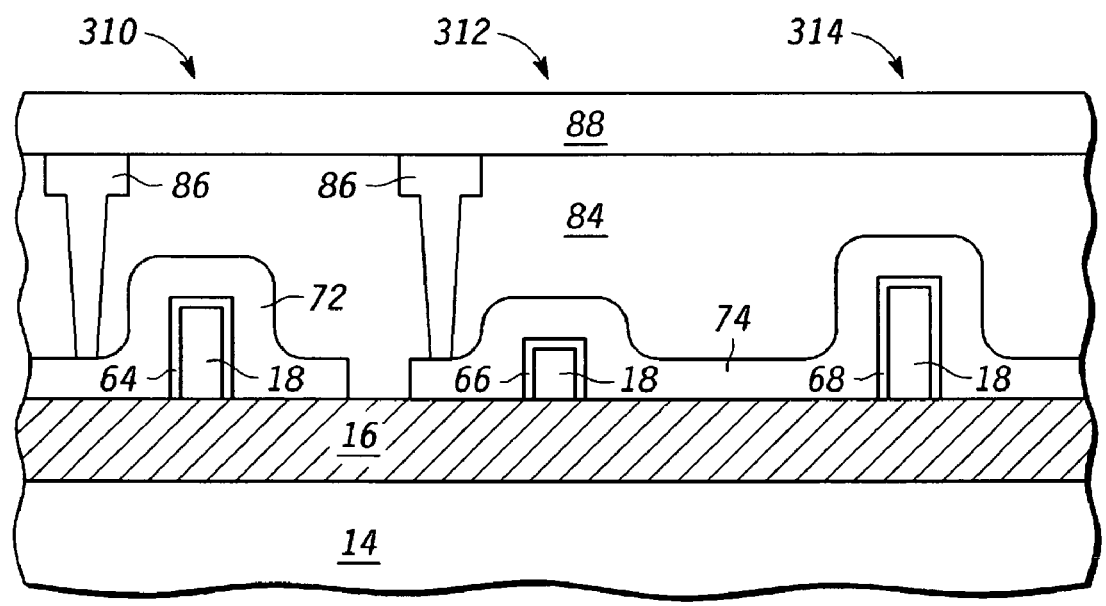

FIG. 8 includes an illustration of a cross-sectional view of a substantially completed electronic device. Location 310 includes a fin-type transistor structure ("FinFET") that includes a semiconductor fin formed from layer 18, layer 64 and a portion of conductive member 72. Location 312 includes a FinFET that includes a semiconductor fin formed from layer 18, layer 66, and a portion of conductive member 74. Location 314 includes a FinFET that includes a semiconductor fin formed from layer 18, layer 68 and a portion of conductive member 74. The channel region can be doped either before or after the subsequent formation of a semiconductor fin.

Processing can be continued to form a substantially completed electronic device. One or more source/drain regions can be formed using a conventional or proprietary process. One or more insulating layers 84, one or more conductive layers 86, and one or more encapsulating layers 88 are formed using one or more conventional or proprietary techniques.

Figure 9:
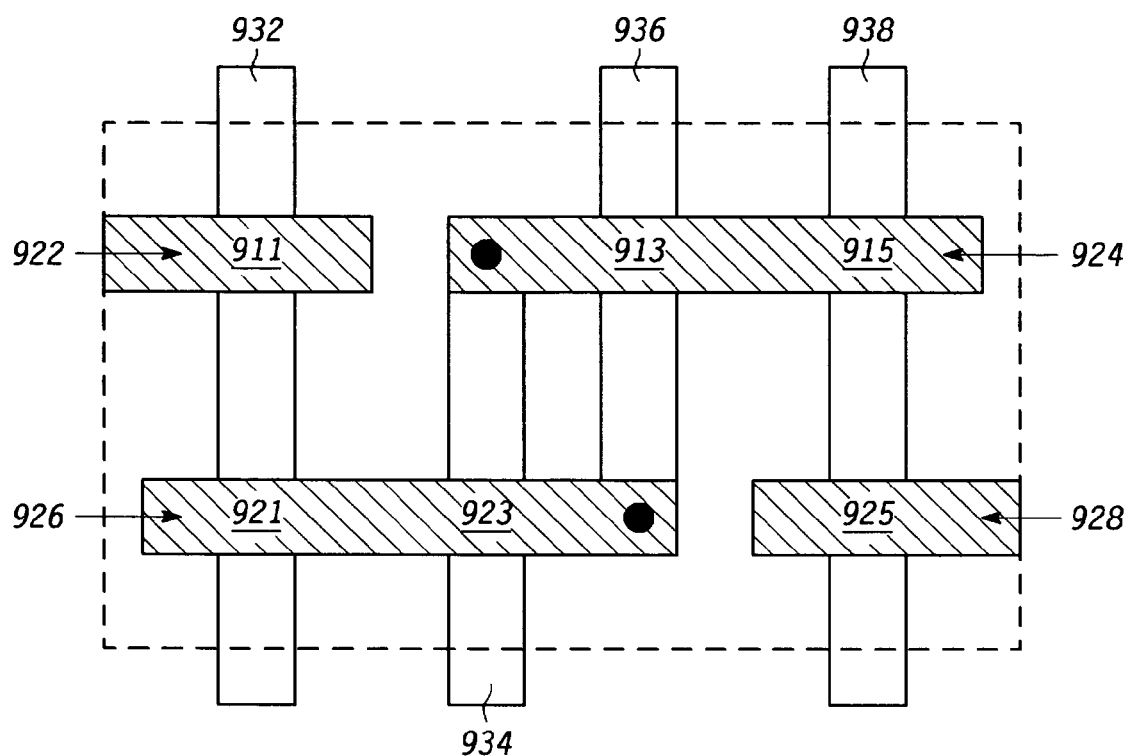
FIG. 9 illustrates a layout for an SRAM cell using FinFET devices.

FIG. 9 illustrates a layout of one embodiment of the present disclosure including a plurality of fin-type transistors arranged in an SRAM cell. Fin type transistors 911, 913, 915, 921, 923, and 925 are formed from gate electrodes 922, 924, 926, and 928, and semiconductor fins 932, 934, 936, and 938. Semiconductor fin 932 can act as a bit line connection and include source/drain regions for transistors 911 and 921. Semiconductor fin 934 can act as a supply connection and include source/drain regions for transistor 923 and a connection to gate electrode 924. Semiconductor fin 936 can act as a supply connection and include source/drain regions for transistor 913 and include a connection to gate electrode 926. Semiconductor fin 938 can act as a bit line connection and include source/drain regions for transistors 915 and 925. Gate electrode 922 can act as a word line connection for transistor 911. Gate electrode 924 is electrically connected to semiconductor fin 934 and can act as a gate electrode for transistors 913 and 915. Gate electrode 926 is electrically connected to semiconductor fin 936 and can act as a gate electrode for transistors 921 and 923. Gate electrode 928 can act as a word line connection for transistor 925.

Transistors 911 and 925 can be n-channel devices and serve as pass gate devices, transistors 921 and 915 can be n-channel devices and serve as pull-down, or latch devices, and transistors 913 and 923 can be p-channel devices and serve as pull-up, or load devices. Referring to FIGS. 8 and 9 together, in the illustrated embodiment, location 310 can be transistor 911, location 312 can be transistor 913, and location 314 can be transistor 915.

Figure 10:
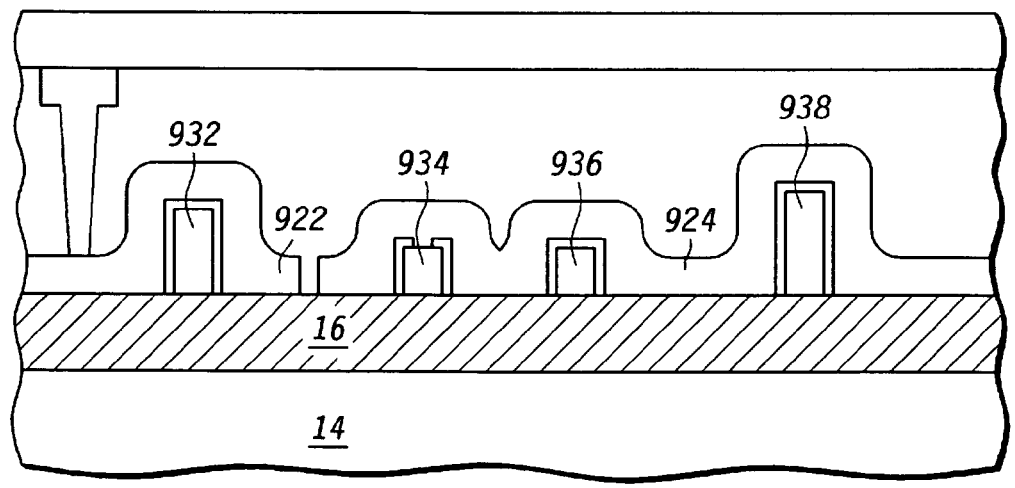
FIG. 10 illustrates a cross-sectional view of a physical embodiment of a portion of the layout.

FIG. 10 illustrates a physical embodiment of a portion of a FinFET SRAM cell that corresponds to transistors 911, 913 and 915. FIG. 10 is a cross-sectional illustration labeled with the same reference numbers those used in the circuit diagram in FIG. 9.

Many different aspects and embodiments are possible. Some of those aspects and embodiments are described below. After reading this specification, skilled artisans will appreciate that those aspects and embodiments are only illustrative and do not limit the scope of the present invention.

Some terms are defined or clarified to aid in understanding this specification. The term "primary surface" is intended to mean a surface from which a transistor structure is subsequently formed. The primary surface may be an original surface of a substrate before forming any electronic components, may be a surface of a semiconductor layer that overlies the base material or may be a surface that becomes exposed during processing. For example, an exposed surface of the insulating layer of a semiconductor-on-insulator substrate can be a primary surface, and not the original surface of the base material.

As used herein, relative directional terms, such as "upper", "over", "overlying", "top", "left", their antonyms, or the like are intended to clarify relative positions within an illustration unless expressly defined otherwise.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the term "height" is intended to mean the physical dimension of distance from the base to the top of a structure in a direction substantially perpendicular to the primary surface.

As used herein, the term "channel length" describes the dimension of the channel region in a direction parallel to the designed direction of carrier flow when the channel region is "on". For example, the channel length can be the shortest distance from one source/drain region of a transistor to the other.

The term "channel width" describes the dimension of the channel region in a direction perpendicular to the designed direction of carrier flow when the channel region is "on". In a conventional FinFET device, the channel width is measured in a direction substantially perpendicular to a primary surface of a substrate.

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts.

In a first aspect, a process for forming an electronic device can include, forming a first semiconductor fin for a first fin-type transistor structure wherein, the first semiconductor fin has a first height. The process can also include removing a portion of the first semiconductor fin to provide the first semiconductor fin with a second height, wherein the second height is smaller than the first height.

In an embodiment of the first aspect, the process can further include, forming a second semiconductor fin for a second fin-type transistor structure prior to removing the portion of the first semiconductor fin, wherein the second semiconductor fin has the first height. In another embodiment, forming the first semiconductor fin and forming the second semiconductor fin includes forming the first semiconductor fin and the second semiconductor fin from a semiconductor layer. In a particular embodiment, forming the second semiconductor fin occurs at a substantially same time as forming the first semiconductor fin. In another particular embodiment, the first semiconductor fin includes a p-channel device, and the second semiconductor fin includes an n-channel device.

In still another particular embodiment of the first aspect, the process can further include, doping the first semiconductor fin with a n-type dopant after removing the portion of the first semiconductor fin, and doping the second semiconductor fin with an p-type dopant after removing the portion of the first semiconductor fin. In yet another particular embodiment, forming the first semiconductor fin includes forming the first semiconductor fin from an n-doped semiconductor region, and forming the second semiconductor fin includes forming the second semiconductor fin from a p-doped semiconductor region.

In another particular embodiment of the first aspect, the second semiconductor fin has the first height after removing the portion of the first semiconductor fin. In still another particular embodiment of the first aspect, forming the first semiconductor fin includes forming the first semiconductor fin from a semiconductor material with a (110) crystal plane for the fin sidewall. In yet another particular embodiment, forming the second semiconductor fin includes forming the second semiconductor fin from a semiconductor material with a (110) crystal plane for the fin sidewall.

In another particular embodiment of the first aspect, the process can further include, forming a third semiconductor fin for a third fin-type transistor structure prior to removing the portion of the first semiconductor fin portion, the third semiconductor fin having the first height. In a more particular embodiment, the process can further include, removing a portion of the third fin-type transistor structure to provide the third semiconductor fin with a third height, wherein the third height is between the first height and the second height.

In a second aspect, a process for forming an electronic device can include, removing a portion of a first semiconductor fin to provide a first fin-type transistor structure a first channel region having a first channel width. The process can also include removing a portion of a second semiconductor fin to provide a second fin-type transistor structure a second channel region having a second channel width.

In a particular embodiment of the second aspect, the first channel region is a channel region of an n-channel transistor. In a more particular embodiment, the first channel width is larger than the second channel width. In another embodiment, the first channel region is a channel region of a p-channel transistor. In still another embodiment, the process can further include forming a third semiconductor fin to provide a third fin-type transistor structure a third channel region having a third channel width different from the first and the second channel widths, wherein the third channel width is larger than the first and second channel widths.

In a third aspect, a process for forming an electronic device can include, forming a first semiconductor fin for a first fin-type transistor structure, the first semiconductor fin having a first height, and forming a second semiconductor fin for a second fin-type transistor structure, the second semiconductor fin having the first height. The process can also include removing a portion of the second semiconductor fin to provide the second semiconductor fin with a second height smaller than the first height. The process can further include forming a first gate electrode overlying the first semiconductor fin wherein a first channel region of the first semiconductor fin has a first channel width approximately equal to twice the first height. The process can also include forming a second gate electrode overlying the second semiconductor fin wherein a second channel region within the second semiconductor fin has a second channel width approximately equal to twice the second height.

In an embodiment of the third aspect, the process can further can include forming a third semiconductor fin for a third fin-type structure, the third semiconductor fin having the first height, and removing a portion of the third semiconductor fin to provide the third semiconductor fin, a third height smaller than the second height. The process can also include forming a third gate electrode overlying the third semiconductor fin, wherein the first semiconductor fin and the third semiconductor fin have different crystal orientation planes for the fin sidewalls. In another embodiment, the first channel region and a third channel region have opposing conductivity types.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires. For example, the doping of fin structures at locations 310, 312, and 314 can occur at a number of points in the process. Thermal activation steps for doping may occur at different locations in the process flow. Although the transistor structures at locations 312 and 314 are illustrated as sharing a gate electrode, in other embodiments, other arrangements of gate electrodes are possible (i.e. locations 310, 312, and 314 may all have separately controlled gate structures). While specific doping and channel types are referred to with respect to transistor structures formed at locations 310, 312, and 314, in other embodiments, any combination of channel types can be formed with the transistor structures at these locations. For example, the transistor structure at location 312 can be an n-type transistor structure and the transistor structures at locations 310 and 314 can each be a p-type transistor.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process for forming an electronic device comprising:
   forming a first semiconductor fin for a first fin-type transistor structure over a support layer of a substrate, wherein, the first semiconductor fin has a first height; and
   removing a portion of the first semiconductor fin to provide the first semiconductor fin with a second height, wherein the second height is smaller than the first height.

2. The process of claim 1, further comprising:
forming a second semiconductor fin for a second fin-type transistor structure over the support layer prior to removing the portion of the first semiconductor fin, wherein the second semiconductor fin has the first height.

3. The process of claim 2 wherein forming the first semiconductor fin and forming the second semiconductor fin comprises forming the first semiconductor fin and the second semiconductor fin from a semiconductor layer of the substrate.

4. The process of claim 2, wherein forming the second semiconductor fin occurs at a substantially same time as forming the first semiconductor fin.

5. The process of claim 2, wherein the first semiconductor fin comprises a p-channel device, and the second semiconductor fin comprises an n-channel device.

6. The process of claim 2, further comprising:
doping the first semiconductor fin with a n-type dopant after removing the portion of the first semiconductor fin; and
doping the second semiconductor fin with an p-type dopant after removing the portion of the first semiconductor fin.

7. The process of claim 2, wherein forming the first semiconductor fin comprises forming the first semiconductor fin from an n-doped semiconductor region, and forming the second semiconductor fin comprises forming the second semiconductor fin from a p-doped semiconductor region.

8. The process of claim 2 wherein the second semiconductor fin has the first height after removing the portion of the first semiconductor fin.

9. The process of claim 2, wherein forming the first semiconductor fin includes forming the first semiconductor fin from a semiconductor material with a (110) crystal plane for the fin sidewall.

10. The process of claim 2, wherein forming the second semiconductor fin includes forming the second semiconductor fin from a semiconductor material with a (110) crystal plane for the fin sidewall.

11. A process of claim 2, further comprising:
forming a third semiconductor fin for a third fin-type transistor structure prior to removing the portion of the first semiconductor fin portion, the third semiconductor fin having the first height.

12. The process of claim 11, further comprising:
removing a portion of the third fin-type transistor structure to provide the third semiconductor fin with a third height, wherein the third height is between the first height and the second height.

13. A process for forming an electronic device, comprising:
forming a first semiconductor fin over a support layer of a substrate;
forming a second semiconductor fin over the support layer;
removing a portion of the first semiconductor fin to provide a first fin-type transistor structure a first channel region having a first channel width; and
removing a portion of the second semiconductor fin to provide a second fin-type transistor structure a second channel region having a second channel width.

14. A process of claim 13, wherein the first channel region is a channel region of an n-channel transistor.

15. A process of claim 13, wherein the first channel width is larger than the second channel width.

16. A process of claim 13, wherein the first channel region is a channel region of a p-channel transistor.

17. A process of claim 13, further comprising:
forming a third semiconductor fin over the support layer of the substrate to provide a third fin-type transistor structure a third channel region having a third channel width different from the first and the second channel widths, wherein the third channel width is larger than the first and second channel widths.

18. A process for forming an electronic device, comprising:
forming a first semiconductor fin for a first fin-type transistor structure, the first semiconductor fin having a first height;
forming a second semiconductor fin for a second fin-type transistor structure, the second semiconductor fin having the first height;
removing a portion of the second semiconductor fin to provide the second semiconductor fin with a second height smaller than the first height; and
forming a first gate electrode overlying the first semiconductor fin wherein a first channel region of the first semiconductor fin has a first channel width approximately equal to twice the first height; and
forming a second gate electrode overlying the second semiconductor fin wherein a second channel region within the second semiconductor fin has a second channel width approximately equal to twice the second height.

19. The semiconductor device of claim 18, further comprising:
forming a third semiconductor fin for a third fin-type structure, the third semiconductor fin having the first height;
removing a portion of the third semiconductor fin to provide the third semiconductor fin, a third height smaller than the second height; and
forming a third gate electrode overlying the third semiconductor fin, wherein the first semiconductor fin and the third semiconductor fin have different crystal orientation planes for the fin sidewalls.

20. The semiconductor device of claim 19, wherein the first channel region and a third channel region have opposing conductivity types.

* * * * *